United States Patent
Tseng et al.

(10) Patent No.: US 9,859,336 B1
(45) Date of Patent: Jan. 2, 2018

(54) SEMICONDUCTOR DEVICE INCLUDING A MEMORY CELL STRUCTURE

(71) Applicant: MACRONIX INTERNATIONAL CO., LTD., Hsinchu (TW)

(72) Inventors: Po-Hao Tseng, Taichung (TW); Feng-Min Lee, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 15/401,155

(22) Filed: Jan. 9, 2017

(51) Int. Cl.
- H01L 27/24 (2006.01)
- H01L 45/00 (2006.01)
- H01L 23/528 (2006.01)
- H01L 23/522 (2006.01)

(52) U.S. Cl.
CPC ........ H01L 27/2463 (2013.01); H01L 23/528 (2013.01); H01L 23/5226 (2013.01); H01L 27/2436 (2013.01); H01L 45/1233 (2013.01); H01L 45/1253 (2013.01); H01L 45/146 (2013.01); H01L 45/1608 (2013.01)

(58) Field of Classification Search
CPC ............... H01L 23/5226; H01L 23/528; H01L 27/2436; H01L 27/2463; H01L 45/04; H01L 45/06; H01L 45/1233; H01L 45/1253; H01L 45/126; H01L 45/146
See application file for complete search history.

(56) References Cited

U.S. PATENT DOCUMENTS

| | | | | |
|---|---|---|---|---|
| 7,067,837 B2* | 6/2006 | Hwang | ............... | H01L 27/2436 257/295 |
| 7,723,716 B2* | 5/2010 | Choi | ............... | H01L 45/06 257/4 |
| 7,863,597 B2* | 1/2011 | Campbell | ............. | H01L 45/085 257/3 |
| 7,871,906 B2* | 1/2011 | Lee | .................... | G11C 13/0004 257/E21.158 |
| 8,189,372 B2* | 5/2012 | Breitwisch | ......... | G11C 13/0004 257/202 |
| 8,279,656 B2* | 10/2012 | Chien | ................... | G11C 5/025 365/148 |
| 9,048,658 B2* | 6/2015 | Lu | ............................. | H02H 9/08 |

(Continued)

FOREIGN PATENT DOCUMENTS

KR 101038997 B1 * 6/2011 ......... H01L 27/2409

OTHER PUBLICATIONS

Chien, et al.: "A Forming-free WOX Resistive Memory Using a Novel Self-aligned Field Enhancement Feature with Excellent Reliability and Scalability"; 978-1-4244-7419-6/10/$26.00 ©2010 IEEE; pp. 19.2.1-19.2.4.

(Continued)

Primary Examiner — Earl Taylor
(74) Attorney, Agent, or Firm — McClure, Qualey & Rodack, LLP

(57) ABSTRACT

A semiconductor device including a memory cell structure is provided, and the memory cell structure includes an insulating layer disposed above a substrate, a bottom electrode embedded in the insulating layer, a resistance switching layer disposed on the bottom electrode, and a top electrode disposed on the resistance switching layer and covering the resistance switching layer. Also, the bottom electrode has a concave top surface lower than a flat upper surface of the insulating layer.

18 Claims, 5 Drawing Sheets

(56) References Cited

U.S. PATENT DOCUMENTS

| | | | |
|---|---|---|---|
| 9,178,144 B1* | 11/2015 | Sung | H01L 45/1253 |
| 9,196,827 B2* | 11/2015 | Oh | H01L 27/0296 |
| 9,209,392 B1* | 12/2015 | Sung | H01L 45/1233 |
| 9,401,472 B1* | 7/2016 | Gopalan | H01L 45/00 |
| 9,431,603 B1* | 8/2016 | Hsieh | H01L 45/085 |
| 9,502,466 B1* | 11/2016 | Chuang | H01L 27/222 |
| 9,520,562 B2* | 12/2016 | Xie | H01L 45/1616 |
| 9,583,700 B2* | 2/2017 | Lee | H01L 45/1233 |
| 2004/0195604 A1* | 10/2004 | Hwang | H01L 27/2436 257/295 |
| 2005/0045915 A1* | 3/2005 | Lee | H01L 45/06 257/202 |
| 2006/0211165 A1* | 9/2006 | Hwang | H01L 27/2436 438/95 |
| 2007/0025226 A1* | 2/2007 | Park | H01L 45/06 369/100 |
| 2007/0164266 A1* | 7/2007 | Choi | H01L 45/06 257/4 |
| 2008/0006813 A1* | 1/2008 | Hayakawa | H01L 27/2436 257/4 |
| 2008/0137400 A1* | 6/2008 | Chen | G11C 8/10 365/163 |
| 2008/0173931 A1* | 7/2008 | Ho | H01L 45/1273 257/324 |
| 2008/0210922 A1* | 9/2008 | Lee | G11C 13/0004 257/3 |
| 2008/0237693 A1* | 10/2008 | Lee | H01L 45/04 257/321 |
| 2008/0308781 A1* | 12/2008 | Liao | H01L 45/145 257/2 |
| 2009/0029031 A1* | 1/2009 | Lowrey | H01L 45/06 427/58 |
| 2009/0189141 A1* | 7/2009 | Shin | H01L 45/06 257/4 |
| 2009/0196094 A1* | 8/2009 | Breitwisch | G11C 13/0004 365/163 |
| 2009/0275198 A1* | 11/2009 | Kamepalli | H01L 45/06 438/659 |
| 2009/0321711 A1* | 12/2009 | Takagi | H01L 27/101 257/5 |
| 2010/0105193 A1* | 4/2010 | Lee | G11C 13/0004 438/478 |
| 2010/0301480 A1* | 12/2010 | Choi | H01L 27/228 257/751 |
| 2012/0008366 A1* | 1/2012 | Lu | G11C 13/0002 365/148 |
| 2012/0195100 A1* | 8/2012 | Saitoh | G11C 13/0007 365/148 |
| 2012/0267595 A1* | 10/2012 | Fang | H01L 27/2454 257/2 |
| 2013/0001502 A1* | 1/2013 | Jung | H01L 45/06 257/4 |
| 2014/0264222 A1* | 9/2014 | Yang | H01L 29/66659 257/2 |
| 2014/0322862 A1* | 10/2014 | Xie | H01L 27/2481 438/104 |
| 2015/0021537 A1* | 1/2015 | Xie | H01L 45/1616 257/2 |
| 2015/0021540 A1* | 1/2015 | Xie | H01L 45/146 257/4 |
| 2015/0090949 A1 | 4/2015 | Chang et al. | |
| 2015/0200363 A1* | 7/2015 | Sacchetto | G11C 13/0007 365/148 |
| 2015/0255718 A1* | 9/2015 | Liu | H01L 45/122 257/4 |
| 2015/0295172 A1* | 10/2015 | Sung | H01L 45/1253 257/2 |
| 2016/0005960 A1* | 1/2016 | Suguro | H01L 21/02244 257/421 |
| 2016/0172420 A1* | 6/2016 | Bajaj | H01L 45/06 365/148 |
| 2016/0218284 A1 | 7/2016 | Lin et al. | |
| 2016/0240776 A1 | 8/2016 | Lin et al. | |
| 2016/0254266 A1* | 9/2016 | Yang | H01L 27/10808 257/532 |
| 2016/0268505 A1* | 9/2016 | Sung | H01L 45/1233 |

OTHER PUBLICATIONS

TIPO Office Action dated Jul. 18, 2017 in Taiwan application (No. 106100355).

\* cited by examiner

SEMICONDUCTOR DEVICE INCLUDING A MEMORY CELL STRUCTURE

BACKGROUND

Field of the Invention

The disclosure relates in general to a semiconductor device including a memory cell structure, more particularly to a semiconductor device including a resistance switching memory cell structure.

Description of the Related Art

Resistive random-access memory (RRAM or ReRAM) device is a non-volatile type of memory cell structure. Resistive memories attract much attention due to its simple MIM (Metal-Insulator-Metal) structure and promising scalability. Different forms of ReRAM have been disclosed, based on different dielectric materials, spanning from perovskites to transition metal oxides to chalcogenides.

Resistance switching memory cell structure, as the example of the transition metal oxide memory, is a group of two-terminal bistable memory devices that stores the data by different resistance levels. For example, a typical ReRAM device includes a tungsten (W) bottom electrode, a $WSi_xO_y$ memory and a TiN top electrode. The switching characteristic of the memory cell structure is very sensitive to the profile and uniformity of the bottom electrode configuration, which consequently has considerable effect on the reliability and electrical performance of the semiconductor device in practical application. It is desirable to develop a resistance switching memory cell structure with excellent structural profile and uniformity for improving the reliability and electrical properties such as great stability of data storage.

SUMMARY

The disclosure relates to a semiconductor device including a memory cell structure, which develops a memory cell structure having a concave bottom electrode and a continuous surface profile between the top surfaces of the bottom electrode and an insulating layer surrounding the bottom electrode, thereby improving the reliability and electrical performance of the memory cell structure.

According to an embodiment, a semiconductor device including a memory cell structure is provided, and the memory cell structure includes an insulating layer disposed above a substrate, a bottom electrode embedded in the insulating layer, a resistance switching layer disposed on the bottom electrode, and a top electrode disposed on the resistance switching layer and covering the resistance switching layer. Also, the bottom electrode has a concave top surface lower than a flat upper surface of the insulating layer.

According to another embodiment, a semiconductor device including a memory cell structure is provided, and the memory cell structure includes a transistor disposed on a substrate; an interconnection structure disposed above the substrate; a passivation layer disposed on the interconnection structure; and a memory cell structure as described above being disposed between the passivation layer and the transistor.

The disclosure will become apparent from the following detailed description of the preferred but non-limiting embodiments. The following description is made with reference to the accompanying drawings.

DETAILED DESCRIPTION

Figure 1:
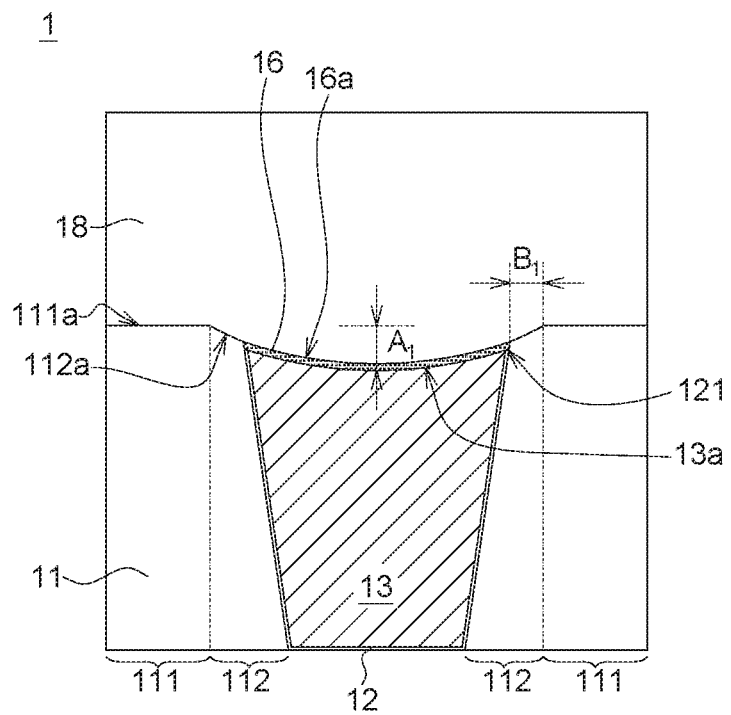
FIG. 1 simply depicts a memory cell structure according to one embodiment of the present disclosure.

In the embodiments of the present disclosure, a semiconductor device including a memory cell structure is provided. A memory cell structure of the embodiment develops a bottom electrode with a concave top surface lower than an upper surface (ex: a flat upper surface) of the insulating layer. According to the embodiment, a top surface of the resistance switching layer and the upper surface of the insulating layer form a continuous surface profile. Configuration of the embodied memory cell structure not only significantly improves properties of the related elements of the memory cell structure (ex: the bottom electrode without edges or shape corners relative to the insulating layer), but also improves the reliability and electrical performance of semiconductor device applied with the embodied memory cell structure.

Several embodiments are provided hereinafter with reference to the accompanying drawings for describing the related procedures and configurations. Related structural details, such as layers and spatial arrangement, are further described in the embodiments. However, the present disclosure is not limited thereto. It is noted that not all embodiments of the invention are shown. The identical and/or similar elements of the embodiments are designated with the same and/or similar reference numerals. Also, it is noted that there may be other embodiments of the present disclosure which are not specifically illustrated. Modifications and variations can be made without departing from the spirit of the disclosure to meet the requirements of the practical applications. It is also important to point out that the illustrations may not be necessarily be drawn to scale. Thus, the specification and the drawings are to be regard as an illustrative sense rather than a restrictive sense.

Moreover, use of ordinal terms such as "first", "second", etc., in the specification and claims to describe an element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

FIG. 1 simply depicts a memory cell structure according to one embodiment of the present disclosure. A memory cell structure 1 comprises an insulating layer 11 (such as an inter-layered dielectric (ILD) layer or an inter-metal (IMD) dielectric layer), a bottom electrode 13 embedded in the insulating layer 11, a resistance switching layer 16 disposed on the bottom electrode 13, and a top electrode 18 disposed on the resistance switching layer 16 and covering the resistance switching layer 16. According to the embodiment, the bottom electrode 13 has a concave top surface 13a lower than a flat upper surface 111a of the insulating layer 11 (i.e. the bottom electrode 13 has a concave profile).

Also, the memory cell structure of the embodiment further comprises a barrier layer 12 (ex: TiN layer) for separating the insulating layer 11 and the bottom electrode 13 (ex: tungsten). Direct deposition of the bottom electrode 13 in the hole of the insulating layer 11 without the barrier layer would cause cracks or peels of the bottom electrode 13 in the subsequently manufacturing process. According to the embodiment, the barrier layer 12 could be regarded as an interface between the insulating layer 11 and the bottom electrode 13, and the concave top surface 13a of the bottom electrode 13 and an upper edge 121 of an interface (ex: the barrier layer 12) between the insulating layer 11 and the bottom electrode 13 constitute a continuous surface profile.

Moreover, as shown in FIG. 1, the insulating layer 11 of the embodiment can be regarded as a combination of a first portion 111 and a second portion 112 adjoining the first portion 111. The first portion 111 has a flat upper surface 111a (ex: parallel to a substrate with the insulating layer 11 formed above), and the second portion 112 has an inclined upper surface 112a, wherein the inclined upper surface 112a of the second portion 112 of the insulating layer 11 inclines downward toward the bottom electrode 13 and the resistance switching layer 16. According to the embodiment, the bottom electrode 13 is surrounded by the second portion 112 of the insulating layer 11, and the concave top surface 13a of the bottom electrode 13 is lower than the flat upper surface 111a of the first portion 111 of the insulating layer 11.

Also, a top surface 16a of the resistance switching layer 16 adjoins the inclined upper surface 112a of the second portion 112 of the insulating layer 11, and the top surface 16a of the resistance switching layer 16 is spaced apart from the flat upper surface 111a of the first portion 111 of the insulating layer 11 (for example, the resistance switching layer 16 separated from the first portion 111 by the second portion 112). According to the embodiment, the top surface 16a of the resistance switching layer 16 and the inclined upper surface 112a of the second portion 112 form a continuous surface profile, as shown in FIG. 1.

According to the embodied memory cell structure of the semiconductor device, the upper surface of the insulating layer 11 is positioned at a higher horizontal level than the top surface of the bottom electrode 13. Thus, as depicted in FIG. 1, the concave top surface 13a of the bottom electrode 13 is lower than the inclined upper surface 112a of the second portion 112 of the insulating layer 11, and the top surface 16a of the resistance switching layer 16 is positioned lower than the flat upper surface 111a of the first portion 111 of the insulating layer 11. In one embodiment, the top surface 16a of the resistance switching layer 16 may also be lower than the inclined upper surface 112a of the second portion 112 of the insulating layer 11. Additionally, FIG. 1 (and other figures in the disclosure) depicts only a single layer as the resistance switching layer 16 for simply illustrating one of possible embodied structures, not for the purpose of limitation. According to the embodiment, the resistance switching layer 16 can be a single layer or a bilayer structure, depending on the requirements of practical application and can be achieved by slightly varying the manufacturing method in the application.

FIG. 2A-FIG. 2D illustrate a method of manufacturing a memory cell structure device according to one embodiment of the present disclosure. Tungsten (W) is exemplified as the material of the bottom electrode 13 in FIG. 2A-FIG. 2D for clear illustration. But the disclosure is not limited to W.

Figure 2A:
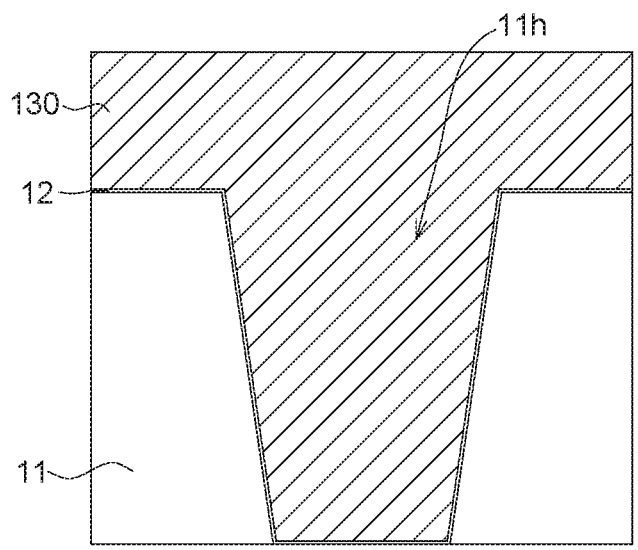
FIG. 2A-FIG. 2D illustrate a method of manufacturing a memory cell structure device according to one embodiment of the present disclosure.

First, an insulating layer 11 having a hole 11h is provided, and a barrier layer 12 (ex: TiN layer) is disposed in the hole 11h, followed by depositing a bottom electrode material layer 130 (ex: tungsten) on the insulating layer 11 and filling up the hole 11h, as shown in FIG. 2A. The barrier layer 12 separates the insulating layer 11 from the bottom electrode material layer 130. Direct deposition of the bottom electrode material layer 130 in the hole of the insulating layer 11 without any barrier layer would cause cracks or peels of the bottom electrode in the subsequently manufacturing process. According to the embodiment, the barrier layer 12 between the bottom electrode 13 and the insulating layer 11 is formed as a thin film for reducing amounts of oxidation of the barrier layer 12 during formation of the resistance switching layer 16. In one embodiment, a thickness of the barrier layer 12 is in (but not limited to) a range of 1 nm to 2.5 nm. The thinner the barrier layer 12 (ex: TiN layer), the less amounts of the oxide nitride (ex: TiONx) disposed in the subsequent oxidation. Additionally, material examples of the bottom electrode material layer 130/bottom electrode 13 include, but not limited to, W, Cu, Fe, Ti, Ni, Hf, TiN, TaN, and other applicable materials.

Figure 2B:
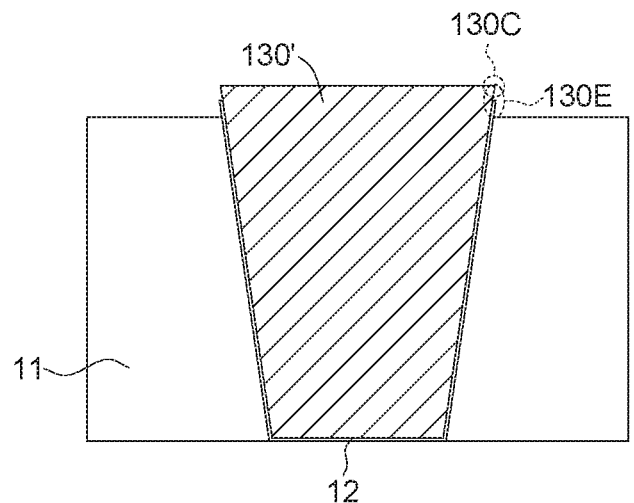

Then, a portion of the bottom electrode material layer 130 on the insulating layer 11 is removed by a planarization step such as chemical-mechanical polishing (CMP), and an oxide buffing (and polishing) would be further conducted to remove the W residuals on the insulating layer 11, so that the remained portion 130' of the bottom electrode material layer protrudes from the insulating layer 11, as shown in FIG. 2B. Configuration of the remained portion 130' of the bottom electrode material layer so far has sharp corners 130C and exposed sidewall/edges 130E, which would have considerably effect on the conformity of the electrical field during an operation of the memory cell structure.

Figure 2C:
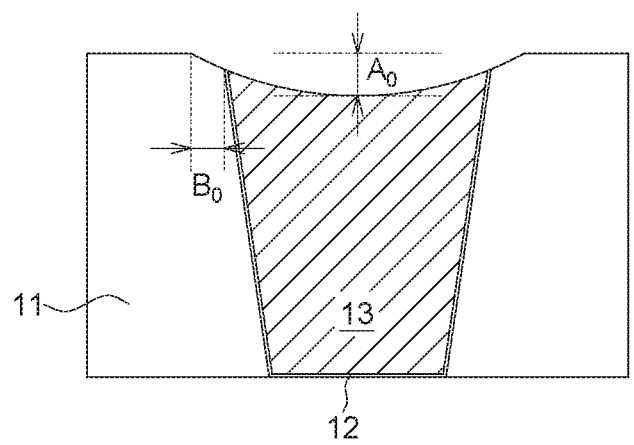

Next, shaping the remained portion 130' of the bottom electrode material layer to form a bottom electrode of the embodiment. In one embodiment, the remained portion 130' of the bottom electrode material layer is shaped by ion bombardment using argon (Ar) plasma to form a bottom electrode 13, wherein the bottom electrode 13 having the concave top surface 13a is embedded in the insulating layer 11 (ex: surrounded by the second portion 112 of the insulating layer 11), and the concave top surface 13a is lower than the flat upper surface 111a of the first portion 111 of the insulating layer 11, as shown in FIG. 2C. In one embodiment, the conditions of argon plasma ion bombardment are (but not limited to):300 B of bias (along the direction vertical to the flat upper surface 111a of the insulating layer 11), 300 W of power, and 12 second of etching time. After shaping the remained portion 130' of the bottom electrode material layer, the sharp corners 130C and the sidewall/edges 130E of the bottom electrode material layer have been eliminated, and a smooth concave top surface 13a of the bottom electrode 13 is acquired. As shown in FIG. 2C, the concave top surface 13a of the bottom electrode 13 and the inclined upper surface 112a of the second portion 112 of the insulating layer 11 constitutes a continuous surface profile, which effectively improves the conformity of the electrical field during an operation of the memory cell structure in a later stage, thereby achieving a better performance of the memory cell structure.

Moreover, a vertical distance $A_0$ and a minimum horizontal distance $B_0$ as shown in FIG. 2C are determined appropriately based on the conditions of practical applications. In one embodiment, a vertical distance $A_0$ between the flat upper surface 111a of the first portion 111 of the insulating layer 11 and a lowest point of the concave top surface 13a of the bottom electrode 13 is in a range of 5 nm to 15 nm (before forming the resistance switching layer 16). In one embodiment, a minimum horizontal distance $B_0$ between an edge of the flat upper surface 111a of the first portion 111 of the insulating layer 11 and an edge of the bottom electrode 13 (or an edge of the barrier layer 12 if formed) is in a range of 30 nm to 50 nm (before forming the resistance switching layer 16). In the manufacturing process, the larger vertical distance $A_0$ would lead to non-uniform oxidation during formation of the resistance switching layer 16, and an non-uniform resistance switching layer would be generated and results in tails bits, which increases the bit error rate (BER) and influences the accuracy of data reading. If the minimum horizontal distance $B_0$ is too long, the oxygen plasma of oxidation during formation of the resistance switching layer 16 would be difficult to focus on the bottom electrode 13 (i.e. weak or insufficient oxidation performed during formation of the resistance switching layer 16), thereby generating an non-uniform resistance switching layer, which results in tails bits and influences the accuracy of data reading. On the contrary, if the minimum horizontal distance $B_0$ is too short, oxygen plasma would be highly focus on the bottom electrode 13, which leads to strong oxidation during formation of the resistance switching layer 16. Strong oxidation may Influence the quality of the resistance switching layer 16, and a memory device with such resistance switching layer may need high voltage to operate in the "forming stage" of the RRAM.

Afterwards, the resistance switching layer 16 is formed by such as a plasma oxidation step, and the top electrode 18 is disposed on the resistance switching layer 16 to covers the resistance switching layer 16, as shown in 2D. After top electrode deposition and definition, a CMOS back-end process may be performed. During the plasma oxidation step, a very small amount of the barrier layer 12 could be also turned into oxides and/or followed by re-sputtering and re-depositing. In one embodiment, a thickness of the resistance switching layer 16 is in the range of 2 nm to 20 nm. Also, during an oxidation process for forming the resistance switching layer 16, part of the bottom electrode 13 is consumed to form the resistance switching layer 16. After forming the resistance switching layer 16 and the top electrode 18, the top surface 16a of the resistance switching layer 16 adjoins the inclined upper surface 112a of the second portion 112 of the insulating layer 11, wherein the top surface 16a of the resistance switching layer 16 and the inclined upper surface 112a of the second portion 112 of the insulating layer 11 constitute a continuous surface profile. Also, according to the experimental result, it is proved that no height difference between the top surface 16a and the inclined upper surface 112a has been observed.

Figure 2D:
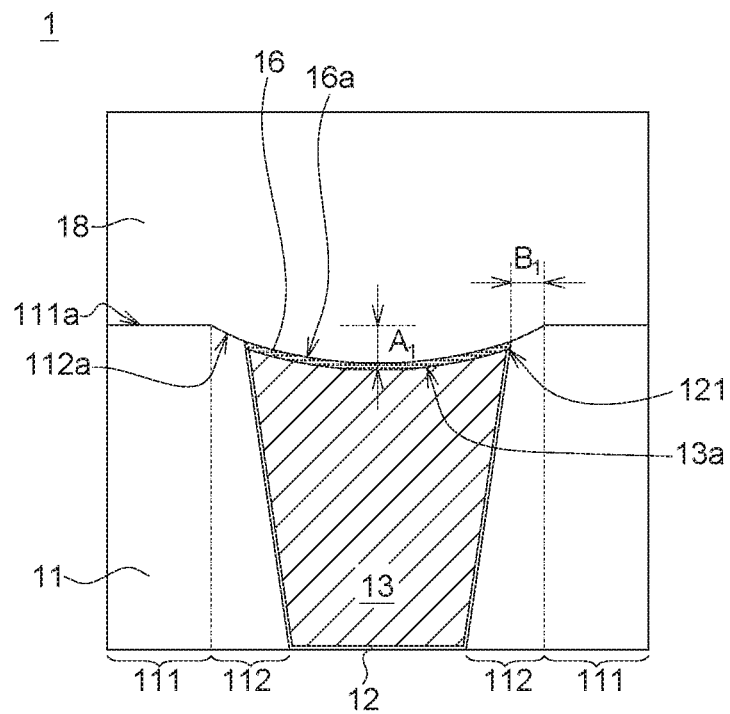

Moreover, in one embodiment, as shown in FIG. 2D, a vertical distance $A_1$ between the flat upper surface 111a of the first portion 111 of the insulating layer 11 and a lowest point of the concave top surface 13a of the bottom electrode 13 is in a range of 7 nm to 35 nm after forming the resistance switching layer 16. In one embodiment, a minimum horizontal distance $B_1$ (may be equal to $B_0$) between an edge of the flat upper surface 111a of the first portion 111 of the insulating layer 11 and an edge of the bottom electrode 13 (or an edge of the barrier layer 12 if formed) is in a range of 30 nm to 50 nm after forming the resistance switching layer 16.

Additionally, material examples of the resistance switching layer 16 (single layer) include, but not limited to, $SiO_2$, $HfO_2$, $TiO_x$, $TiON$, $WO_x$, $Ta_2O_5$, $Al_2O_3$, and other applicable materials. It is noted that those material examples listed above are provided for illustration, not for limitation. Those numerical values listed above are provided for illustration, not for limitation. The numerical values of the related components or distances, such as the thicknesses of the barrier layer 12 and the resistance switching layer 16, the distances $A_0$, $B_0$, $A_1$, $B_1$, can be varied and/or determined according to the requirements of the actual applications.

Figure 3:
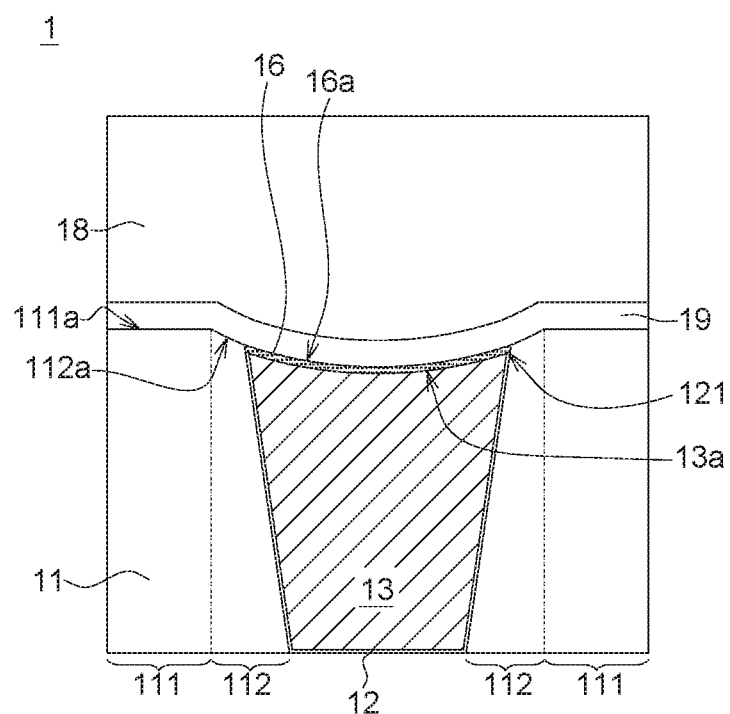
FIG. 3 simply depicts a memory cell structure according to another embodiment of the present disclosure.

FIG. 3 simply depicts a memory cell structure according to another embodiment of the present disclosure. Please also refer to FIG. 1. Structures of FIG. 3 and FIG. 1 are identical, except for formation of an oxygen ion reservoir layer 19. Also, the identical and/or similar elements in the structures of FIG. 3 and FIG. 1 are designated with the same and/or similar reference numerals, and the details of the configurations, procedures and working principles of the identical components/layers are not redundantly described. As shown in FIG. 3, an oxygen ion reservoir layer 19 of the memory cell structure 1' can be optionally deposited between the top electrode 18 and the resistance switching layer 16 for providing oxygen to enhance switching performance of the device. Material examples of the oxygen ion reservoir layer 19 include, but not limited to, $TiO_x$, $TiON$, $HfO_2$, $Al_2O_3$, $Ta_2O_5$, and other applicable materials.

Figure 4:
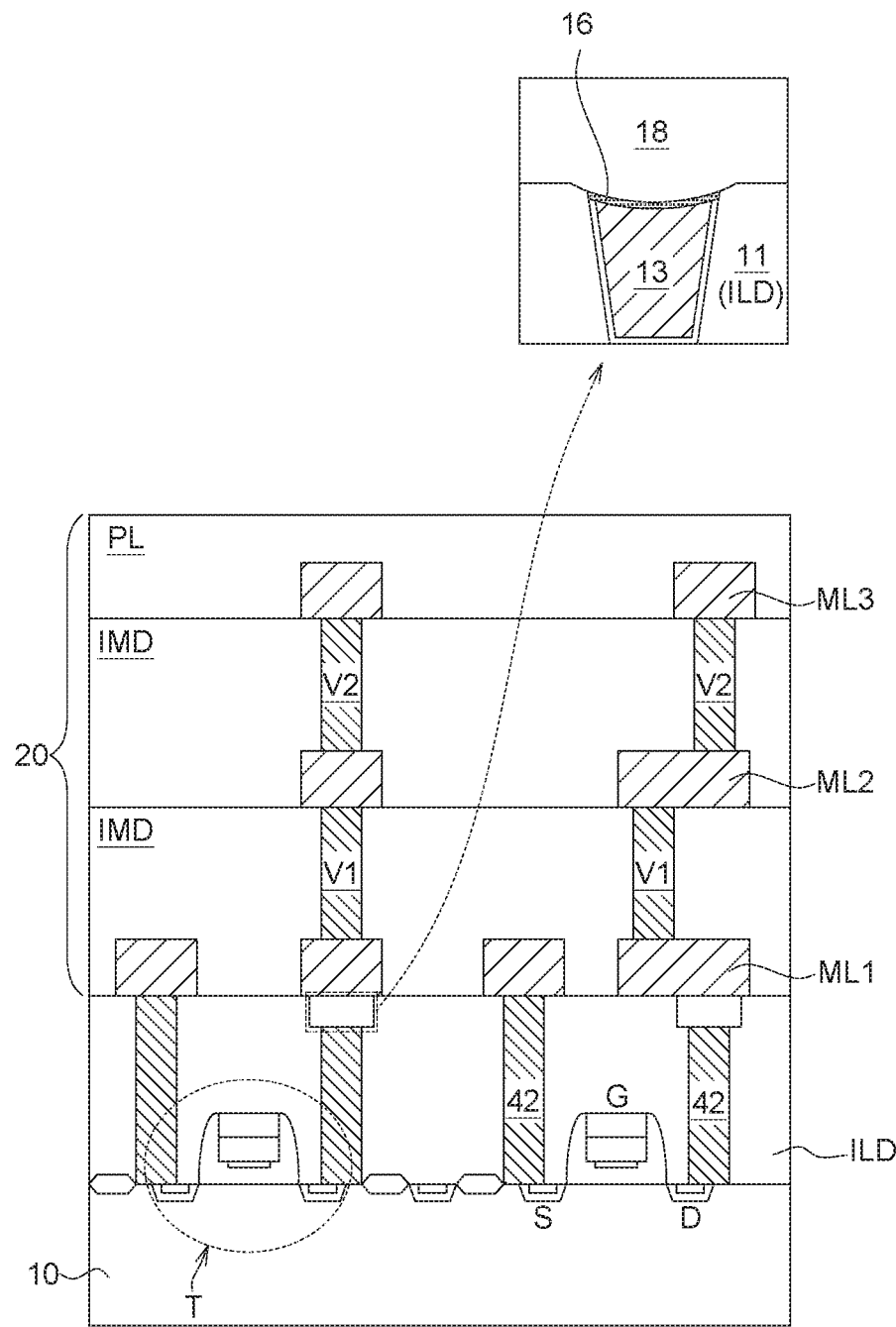
FIG. 4 simply depicts a semiconductor device having an embodied memory cell structure related to the contact according to one application of the present disclosure.
Figure 5:
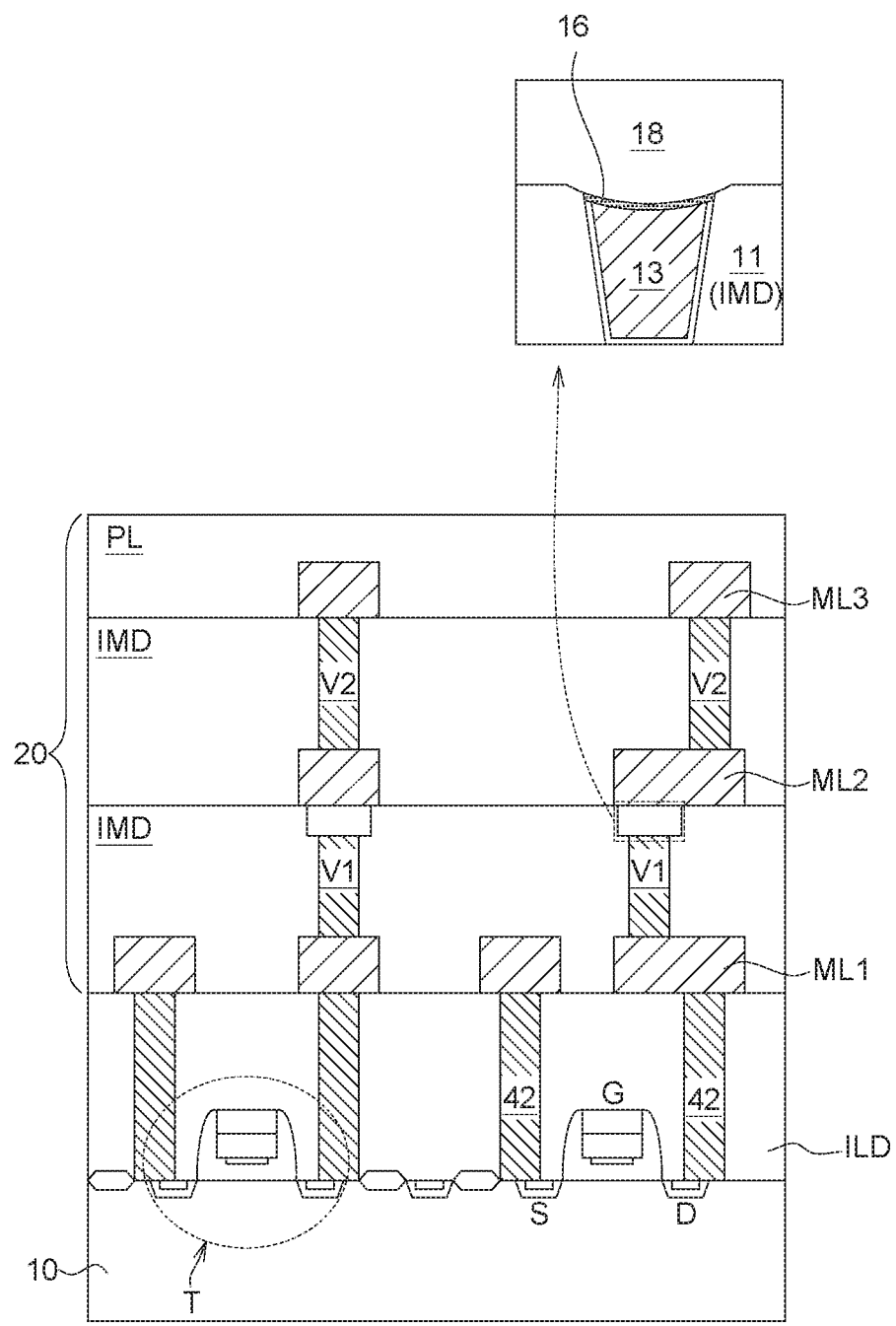
FIG. 5 simply depicts a semiconductor device having an embodied memory cell structure related to the via according to another application of the present disclosure.

There are several applications for interposing the embodied memory cell structure into a semiconductor device. Two of the applications are provided for illustration, but not for limitation. FIG. 4 simply depicts a semiconductor device having an embodied memory cell structure related to the contact according to one application of the present disclosure. FIG. 5 simply depicts a semiconductor device having an embodied memory cell structure related to the via according to another application of the present disclosure. Please refer to FIG. 4, FIG. 5 and FIG. 1.

According to the applications, a semiconductor device includes a transistor T disposed on a substrate 10; an inter-layer dielectric layer ILD disposed on the substrate 10 and covering the transistor T; an interconnection structure 20, disposed above the substrate and on the inter-layer dielectric layer ILD; a passivation layer PL formed on the interconnection structure 20; and an embodied memory cell structure 1 (or 1', as shown in FIG. 1 or FIG. 3). According to the applications applied with the embodiment design, the embodied memory cell structure can be disposed between the passivation layer PL and the transistor T. As shown in FIG. 4 and FIG. 5, the transistor T comprises a gate electrode G, a source region S and a drain region D. At least two conductive contacts 42 are disposed within the inter-layer dielectric layer ILD and respectively connected to the source region S and the drain region D of the transistor T. Also, the interconnection structure 20 comprises interconnect layers respectively buried in the inter-metal dielectric layers IMD. Examples of the interconnect layers include vias and metal lines, such as the first metal line ML1, the first via V1, the second metal line ML2, the second via V2 and the third metal line ML3.

As shown in FIG. 4, one of the two conductive contacts 42 is a portion of the embodied memory cell structure, wherein the insulating layer 11 for embedding the bottom electrode 13 of the embodied memory cell structure as described above is the inter-layer dielectric layer ILD.

Alternatively, as shown in FIG. 5, one of the vias, such as on the first via V1 or on the second via V2, is a portion of the embodied memory cell structure, wherein the insulating layer 11 for embedding the bottom electrode 13 of the embodied memory cell structure as described above is one of the inter-metal dielectric layers IMD. Although the interconnection structure 20 with two IMD (ex: two vias V1-V2 and three metal lines ML1-ML3) and the embodied memory cell structure related to the first via V1 are exemplified for illustration (FIG. 5), the disclosure is not limited thereto. The numbers of the IMD layers, the vias and the metal lines can be determined according to the practical conditions, and the position of the embodied memory cell structure can be varied to meet the requirements of the practical applications (ex: can be related to the vias such as V2, V3, V4, . . . etc.).

Typically, the passivation layer PL comprises hydrogen ions ($H^+$). The hydrogen ions ($H^+$) (migrated from the passivation layer PL) also induces filament rupture at the resistance switching layer 16, which causes retention loss. For the semiconductor device in FIG. 4, a longer distance between the embodied memory cell structure (ex: ReRAM) and the passivation layer PL does reduce the possibility of the hydrogen ions ($H^+$) in the passivation layer PL reaching the resistance switching layer 16. Thus, the memory cell on the contact 42 as shown in FIG. 4 may enhance retention characteristic of the memory cell.

For the semiconductor device in FIG. 5, the embodied memory cell structure (ex: ReRAM) related to the via (ex: V1, or V2, or . . . etc.) can reduce thermal budget effect, thereby obtaining a high quality resistance switching layer 16 to enhance endurance characteristic of the memory cell.

According to the aforementioned description, a bottom electrode 13 with a concave top surface 13a is formed, and the concave top surface 13a lower than an upper surface (ex: a flat upper surface 111a of the first portion 111) of the insulating layer 11. Also, a continuous surface profile comprises the concave top surface 13a of the bottom electrode 13 and an upper edge of an interface between the insulating layer 11 and the bottom electrode 13 according to the design of the embodiment. Configuration of the embodied memory cell structure effectively improves electrical characteristics of the memory cell structure. Also, enhancements of the reliability and performance of the semiconductor device in the application can be achieved according to the structure and method provided in the embodiments.

Other embodiments with different configurations of known elements in the device can be applicable, and the arrangement depends on the actual needs of the practical applications. It is, of course, noted that the configurations of figures are depicted only for demonstration, not for limitation. It is known by people skilled in the art that the shapes or positional relationship of the constituting elements and the procedure details could be adjusted according to the requirements and/or manufacturing steps of the practical applications.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor device including a memory cell structure, the memory cell structure comprising:
   an insulating layer disposed above a substrate, and the insulating layer comprising:
      a first portion, having a flat upper surface parallel to the substrate; and
      a second portion, adjoining the first portion, and the second portion having an inclined upper surface;
   a bottom electrode embedded in the insulating layer, and the bottom electrode having a concave top surface lower than the flat upper surface of the first portion of the insulating layer;
   a resistance switching layer disposed on the bottom electrode; and
   a top electrode, disposed on the resistance switching layer and covering the resistance switching layer,
   wherein a top surface of the resistance switching layer adjoins the inclined upper surface of the second portion of the insulating layer, and the top surface of the resistance switching layer and the inclined upper surface of the second portion of the insulating layer form a continuous concave surface profile.

2. The semiconductor device according to claim 1, wherein the inclined upper surface of the second portion of the insulating layer inclines downward toward the bottom electrode and the resistance switching layer.

3. The semiconductor device according to claim 2, wherein the bottom electrode is surrounded by the second portion of the insulating layer, and the concave top surface of the bottom electrode is lower than the flat upper surface of the first portion of the insulating layer.

4. The semiconductor device according to claim 2, wherein a top surface of the resistance switching layer is spaced apart from the flat upper surface of the first portion of the insulating layer.

5. The semiconductor device according to claim 2, wherein a top surface of the resistance switching layer is positioned lower than the flat upper surface of the first portion of the insulating layer.

6. The semiconductor device according to claim 2, wherein the concave top surface of the bottom electrode is lower than the inclined upper surface of the second portion of the insulating layer.

7. The semiconductor device according to claim 2, wherein a vertical distance between the flat upper surface of the first portion of the insulating layer and a lowest point of the concave top surface of the bottom electrode is in a range of 7 nm to 35 nm.

8. The semiconductor device according to claim 1, wherein a minimum horizontal distance between an edge of the flat upper surface of the first portion of the insulating layer and an edge of the bottom electrode is in a range of 30 nm to 50 nm.

9. The semiconductor device according to claim 1, wherein a continuous surface profile comprises the concave top surface of the bottom electrode and an upper edge of an interface between the insulating layer and the bottom electrode.

10. A semiconductor device including a memory cell structure, comprising:
   a transistor disposed on a substrate;
   an interconnection structure, disposed above the substrate;
   a passivation layer, disposed on the interconnection structure; and
   the memory cell structure, disposed between the passivation layer and the transistor, and the memory cell structure comprising:
      a bottom electrode embedded in an insulating layer, and the bottom electrode having a concave top surface lower than a flat upper surface of the insulating layer;
      a resistance switching layer disposed on the bottom electrode; and a top electrode, disposed on the resistance switching layer and covering the resistance switching layer,
wherein the insulating layer comprises:
a first portion, having the flat upper surface parallel to the substrate; and
a second portion, adjoining the first portion, and the second portion having an inclined upper surface,
wherein a top surface of the resistance switching layer and the inclined upper surface of the second portion of the insulating layer form a continuous concave surface profile.

11. The semiconductor device according to claim 10, further comprising an inter-layer dielectric (ILD) layer disposed on the substrate and covering the transistor, and the interconnection structure are disposed on the ILD layer, wherein at least two conductive contacts are disposed within the ILD layer and electrically connected to the transistor, and the interconnection structure comprises interconnect layers respectively buried in inter-metal dielectric (IMD) layers.

12. The semiconductor device according to claim 11, wherein one of the at least two conductive contacts is a portion of the memory cell structure, and the insulating layer for embedding the bottom electrode of the memory cell structure is the ILD layer.

13. The semiconductor device according to claim 11, wherein the interconnection structure comprises interconnect layers respectively buried in inter-metal dielectric (IMD) layers, and the interconnect layers comprise vias and metal lines, wherein one of the vias is a portion of the memory cell structure, and the insulating layer for embedding the bottom electrode of the memory cell structure is one of the IMD layers.

14. The semiconductor device according to claim 10, wherein the bottom electrode embedded in the insulating layer is surrounded by the second portion of the insulating layer, and the concave top surface of the bottom electrode is lower than the flat upper surface of the first portion of the insulating layer.

15. The semiconductor device according to claim 14, wherein the inclined upper surface of the second portion of the insulating layer inclines downward toward the bottom electrode and the resistance switching layer, and a top surface of the resistance switching layer adjoins the inclined upper surface of the second portion of the insulating layer.

16. The semiconductor device according to claim 14, wherein a top surface of the resistance switching layer is spaced apart from the flat upper surface of the first portion of the insulating layer.

17. The semiconductor device according to claim 14, wherein a vertical distance between an edge of the flat upper surface of the first portion of the insulating layer and a lowest point of the concave top surface of the bottom electrode is in a range of 7 nm to 35 nm; and
a minimum horizontal distance between the flat upper surface of the first portion of the insulating layer and an edge of the bottom electrode is in a range of 30 nm to 50 nm.

18. The semiconductor device according to claim 10, wherein a continuous surface profile comprises the concave top surface of the bottom electrode and an upper edge of an interface between the insulating layer and the bottom electrode.

* * * * *